United States Patent [19]
Petersen

[11] 4,427,247
[45] Jan. 24, 1984

[54] MAGNETIC BUBBLE MEMORY SOCKET

[75] Inventor: Richard W. Petersen, Taunton, Mass.

[73] Assignee: Augat Inc., Mansfield, Mass.

[21] Appl. No.: 273,119

[22] Filed: Jun. 12, 1981

[51] Int. Cl.$^3$ .......................... H01R 4/66; H01R 9/09
[52] U.S. Cl. ............................ 339/14 R; 339/17 CF; 339/174
[58] Field of Search ................ 339/17 CF, 174, 14 R

[56] References Cited

U.S. PATENT DOCUMENTS

| | | | |
|---|---|---|---|
| 3,391,383 | 7/1968 | Antes | 339/174 |
| 3,771,109 | 11/1973 | Bruckner et al. | 339/174 |
| 3,955,867 | 5/1976 | Braun et al. | 339/17 CF |
| 4,334,727 | 6/1982 | Scheingold et al. | 339/17 CF |

FOREIGN PATENT DOCUMENTS 2008333  5/1979  United Kingdom ........... 339/17 CF

Primary Examiner—Eugene F. Desmond
Attorney, Agent, or Firm—Weingarten, Schurgin, Gagnebin & Hayes

[57] ABSTRACT

An electrical socket for a magnetic bubble memory and which is operative to retain the memory in proper electrical contact even in the presence of vibrational and other external forces to which the memory may be subjected during use. The socket comprises a base adapted for mounting on a circuit board and having an array of electrical spring contacts matable with the contacts of a bubble memory module. A cover assembly is pivotally attached to the base and includes a pair of latch arms movable to a closed position to urge the memory module into intimate electrical contact with the socket terminals, the arms being retained in closed position by latches associated with the base. The socket can be electrically grounded via the cover assembly.

13 Claims, 4 Drawing Figures

MAGNETIC BUBBLE MEMORY SOCKET

FIELD OF THE INVENTION

This invention relates to electronic component sockets and more particularly to a socket for a magnetic bubble memory and which is capable of retaining the memory in position even in the presence of vibrational and other external forces.

BACKGROUND OF THE INVENTION

Magnetic bubble memories are known wherein data is stored in magnetic domains present within a medium. Such memories are often packaged as a plug-in module which includes a generally rectangular metal enclosure containing the storage medium on a ceramic substrate which has opposed edges which extend from opposite sides of the enclosure, the substrate edges having electrical contacts formed thereon for connection to associated circuitry by way of a mounting socket. Such memory modules are relatively bulky and heavy in relation to usual electronic components and must be accurately supported. Moreover, such modules must be mounted in precise orientation to provide intended operation. By reason of their relatively high physical mass, such modules must be positively retained to prevent disconnection of the device by external forces such as vibration which can occur in marine, aeronautical, and industrial environments.

SUMMARY OF THE INVENTION

In brief, the present invention provides a socket for a magnetic bubble memory which retains the memory in proper electrical contact with its associated circuit even in the presence of vibrational and other external forces to which the memory can be subjected during use. The novel socket comprises a base adapted for mounting on a circuit board and containing an array of electrical spring contacts in a pattern for mating with the contacts of a bubble memory module. A pair of latch arms are pivotably mounted to the socket base and are operative to urge the memory module into intimate electrical contact with the spring terminals of the socket, the arms being retained in closed position by latches associated with the socket base. The socket can be electrically grounded through the latch arms to provide an electrically neutral metal structure in the vicinity of the magnetic bubble memory to prevent interference with memory operation.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
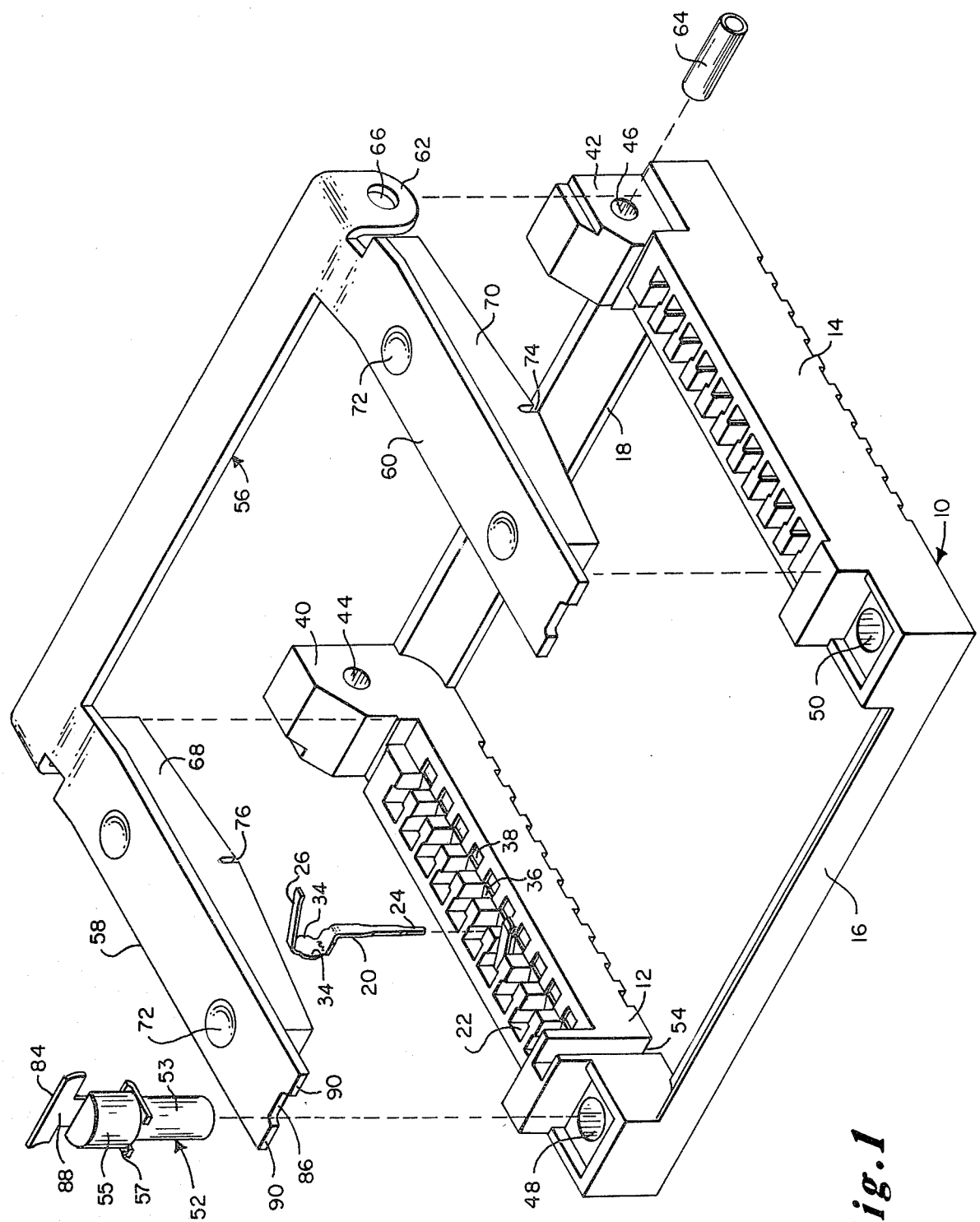
FIG. 1 is an exploded pictorial view of a magnetic bubble memory socket embodying the invention.
Figure 2:
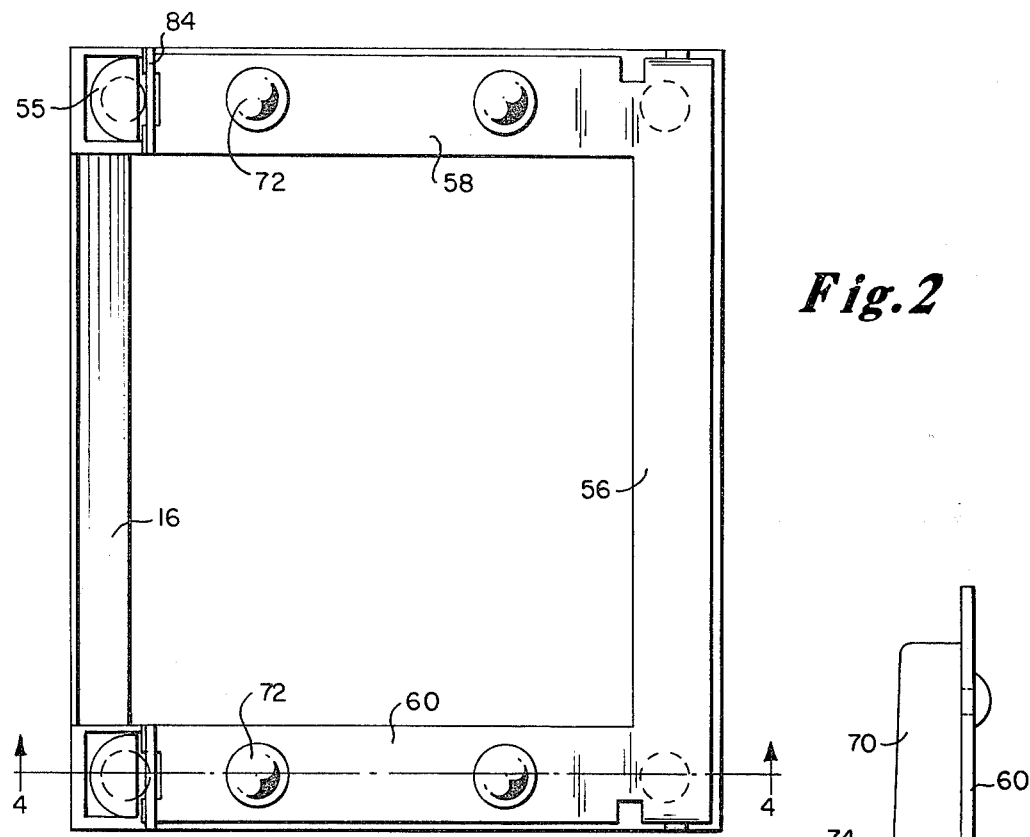
FIG. 2 is a top view of the embodiment of FIG. 1.
Figure 3:
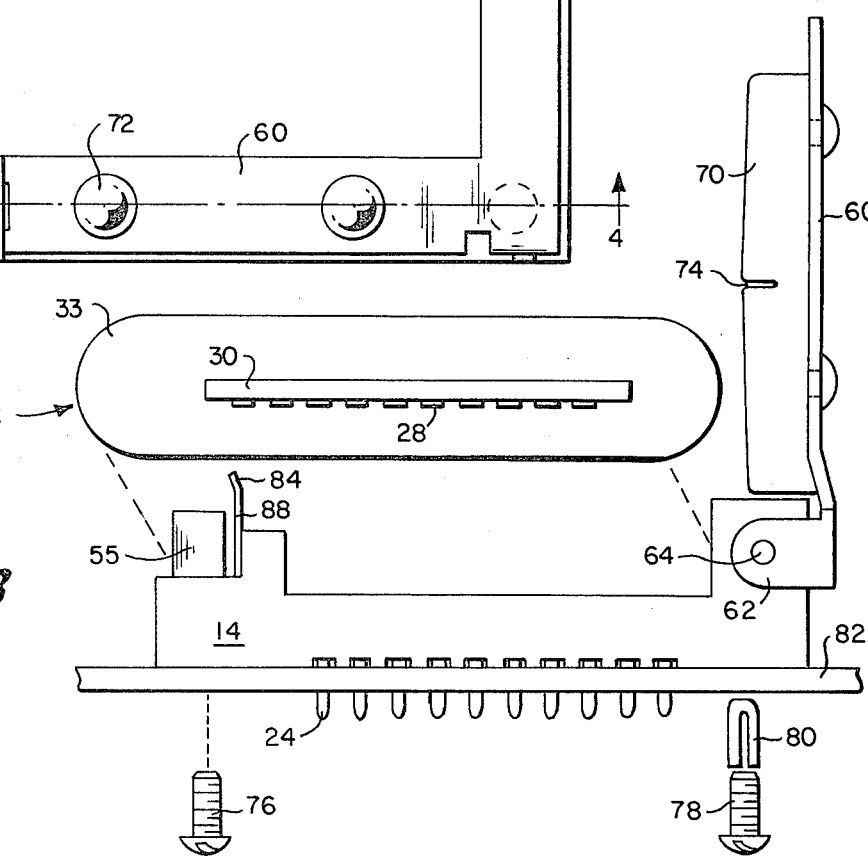
FIG. 3 is an elevation view of the embodiment of FIG. 1.
Figure 4:
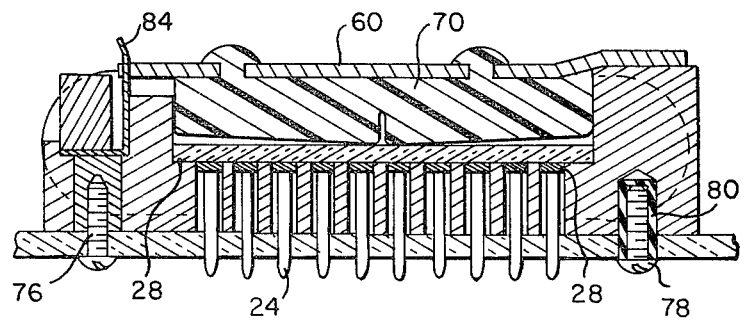
FIG. 4 is a sectional elevation view taken along lines 4—4 of FIG. 2.

The magnetic bubble memory constructed and operative in accordance with the invention is illustrated in preferred embodiment in FIGS. 1-4 of the drawing and includes a body 10 of electrically insulative material and having side members 12 and 14 joined by front and rear body portions 16 and 18, respectively. Each side member 12 and 14 includes a linear array of electrical terminals 20 installed in respective openings 22 in the side arms. The terminals 20 include a lead or pin portion 24 which extends outward from the bottom of the base 10 for insertion into corresponding openings of a circuit board, as illustrated in FIGS. 3 and 4, and by which the socket is electrically connected to the conductive paths of the circuit board, typically by soldering. The terminals also include a spring contact portion 26 which has an upper contact surface matable with the respective contacts 28 which are provided on the bottom surface of the ceramic substrate 30 of the magnetic bubble memory module 32 (FIG. 3). The electrical terminals 20 are retained within the respective openings 22 of the socket base by barbs 34 which bite into the confronting walls of the openings 22 to effectively lock the terminals within the socket base. Openings 22 may be widened slightly to accommodate barbs 34. A surface 36 is provided at the inward end of each opening 22, this surface terminating in a recessed surface 38, which receives the end of portion 26. Surface 36 provides an anti-overstress shelf onto which the contacts 26 bottom out under the force of the latching arms permitting probing of contacts 26 without separation from contacts 28.

The side arms 12 and 14 terminate at their rearward ends in pedestals 40 and 42 containing respective aligned openings 44 and 46. The forward ends of the side members 12 and 14 include openings 48 and 50 into which respective studs 52 are disposed, each stud 52 having a latch mechanism for retention of the socket cover, as will be described. A key slot 54 is provided near the front end of side member 12 and is cooperative with a key element on the memory module to ensure installation of the module in correct electrical disposition. Each stud 52 includes a knurled cylindrical portion 52 adapted for retention within respective openings 48 and 50, and an enlarged semi-cylindrical head portion 55. The latch spring element 84 is abutted against the flat surface of head portion 55, the spring element being retained on the stud by a pair of tines 57 cooperative with a groove provided on the stud at the juncture of the portions 53 and 55.

The cover or clamping assembly includes a generally C-shaped stainless steel or other suitable metal frame 56 which includes first and second latch arms 58 and 60 which extend over the respective contact arrays of the side members 12 and 14, and a pair of flanges 62 which fit along the respective sides of pedestals 40 and 42 and are secured thereto by respective pivot pins 64 installed in respective openings 66 in the flanges and into respective openings in the pedestals 40 and 42. An elongated electrically insulative member 68 is affixed to the underside of arm 58, and a similar member 70 is affixed to the underside of arm 60. These members 68 and 70 are of plastic material and are affixed to the respective metal arms 58 and 60 by plastic tabs 72, typically formed by heading over integral posts upstanding from members 68 and 70 and extending through aligned openings in the arms 58 and 60. The members 68 and 70 are of a length to extend across the entire array of contacts 26, and each includes a centrally disposed groove 74 extending laterally thereacross and between the lower surfaces of the members which slope upwardly from the slot. The members 68 and 70 are thus able to bend to a slight degree about the central groove 74 to provide a loading force onto the underlying substrate of an installed memory module to maintain the module contacts in engagement with the respective contacts 26 of the socket.

The magnetic bubble memory module 32 includes a rectangular metal enclosure 33 which contains the storage medium on a ceramic substrate 30, the substrate extending outwardly from opposite sides of the enclosure. Electrical contact areas 28 are disposed along the bottom surface of the oppositely extending substrate edges. These contacts 28 are connected to the memory by respective conductive paths which are formed on the same or opposite surfaces of the substrate 30. The memory module with which the novel socket is employed can be, for example, an Intel 7110 magnetic bubble memory or its equivalent.

The socket is retained on a circuit board by fasteners operative with mounting openings in studs 52 and in pedestals 40 and 42. More particularly, a threaded fastener 76 is cooperative with a threaded hole provided in each stud 52. A threaded fastener 78 is cooperative with a threadable insert 80 which is inserted within the opening provided in each pedestal 40 and 42. The socket is thus mounted to the circuit board by the fasteners 76 and 78, with the leads 24 of the socket contacts extending through respective openings of the circuit board 82 for soldering or other electrical connection to the conductive paths of the circuit provided on circuit board 82. The metal frame 56 of the cover assembly along with pins 64 can be electrically grounded by an electrical path provided by frame 56, studs 52, and metal fasteners 76, the fasteners being in contact with a ground plane on the bottom surface of the circuit board 82.

The memory module identified above requires installation at a tilted orientation for purposes of proper magnetic field excitation; specifically, a tilt of 2.5° from the horizontal. The socket provides this angular orientation by the relative dimensioning of side members 12 and 14, and members 68 and 70. The side member 12 is of lesser height than side member 14 to provide a 2.5° tilt to the mounted memory module 32. The member 68 is of greater height than member 70 to accommodate the lower disposition of the mounted module and to engage the module substrate 30 for securing the module contacts 28 in electrical connection to the socket contacts 26.

The frame 56 is readily raised to an upward position to allow installation of a memory module therein, as illustrated in FIG. 3. In order to secure the memory module in place within the socket, the cover frame 56 is pivoted downward and is locked into its closed position by a latch spring element 84 at the upper portion of each stud 52 and which is operative to snap over the ends of the respective arms 58 and 60 to retain the frame in its downward position. The outer ends of the arms 58 and 60 each include a recess 86 for accommodation of the shank 88 of the spring element 84. During closure of the frame 56, the outer edges 90 of the arms 58 and 60 engage the curved surface of the spring element 84 to push the element outward and allow the element to snap back within the recess 86 when the cover is in its closed position to thereby latch the cover, as shown in FIG. 4. In the closed position, the central portion of each member 68 and 70 engages the substrate of the memory module, as illustrated in FIG. 4, to provide a downward force on the substrate which maintains the module contacts 28 in positive engagement with the spring contacts 26 of the socket.

The socket body 10 is preferably molded of a suitable plastic material such as thermoplastic polyester, as are the members 68 and 70. The frame 56 is preferably of type 410 stainless steel which is capable of heat treating to obtain the intended yield strength. The pivot pins 64 and spring elements 84 are also typically of stainless steel. The studs 52 are nickel-plated brass, and the terminals 20 are beryllium copper. Gold plating is typically provided on contact portions 26, while the lead portions 24 are tinned for ease of subsequent soldering. In typical embodiment, the socket is about 2 inches in width and about 1¾ inches in depth, with a height of approximately ½ inch.

The invention is not to be limited except as indicated in the appended claims.

What is claimed is:

1. A magnetic bubble memory socket comprising:
  a base having first and second side members disposed in spaced parallel disposition, each of the side members having a row of electrical terminals for mating with the electrical contacts of a magnetic bubble memory module;
  each of said electrical contacts having a depending electrode tail extending below the bottom surface of corresponding side members, and a resilient spring head portion extending laterally inwardly from the top surface of corresponding side members, each of said terminals are mounted in spaced-apart apertures that extend from the top to the bottom surface of corresponding side members, each of the top mouths of each of the apertures is in communication with an anti-overstress recess onto which corresponding resilient spaced-apart head portions are received for permitting probing of the contact head portions;
  a cover assembly pivotally connected to the base and including first and second electrically conducting latch arms, each disposed in alignment with respective ones of the side members of the base and first and second electrically non-conducting, resilient and elongated pads mounted to respective first and second latch arms;
  metallic latch means on the base for retaining the latch arms of the cover assembly in a closed position, where the first and second elongated, electrically non-conducting, resilient pads are operative to secure a magnetic bubble memory module in the socket with the contacts of the module in positive electrical connection with the terminals of the socket;
  means for mounting the first and second side members to a circuit board; and
  said first and second latch arms are electrically grounded by way of the latch means and mounted means.

2. A magnetic bubble memory socket comprising:
  a base having first and second side members disposed in parallel spaced relationship, each side member including a forward end and a rearward end and means joining said first and second side members;
  a plurality of electrical terminals disposed in respective openings provided in each side member forming a contact array matable with the electrical contacts of a magnetic bubble memory module;
  each of said openings terminating along corresponding top surfaces of respective side members in anti-overstress shelves permitting probing of the terminals;

each of the electrical terminals having a spring contact upwardly extending from the associated side member and aligned in corresponding ones of the anti-overstress shelves, and a lead portion downwardly extending from the bottom of the associated side member and adapted for insertion through a circuit board on which the socket is mounted and for electrical connection to the circuit board;

a cover assembly pivotally connected to the base and including:

a metal frame having first and second spaced-apart metallic latch arms each disposed in alignment with respective ones of the side members of the base;

first and second elongated insulating members each disposed on a respective one of the latch arms and each being yieldably engageable with the memory module installed on the socket to provide position engagement of the contacts of the electrical terminals with respective contacts of the module when the cover assembly is in a closed position;

pivot means at the rearward end of each of the side members and pivotally attaching the cover assembly to the base;

electrically conductive latch means at the forward end of the side members and operative to retain and electrically contact the latch arms in a closed position, where corresponding elongated insulating members resiliently abut and secure the memory module in the socket;

means for mounting the base to a circuit board having a ground plane; and said mounting means including a metallic fastener connected to both the ground plane of the circuit board and to the metallic latch arms for grounding the metallic latch arms.

3. The socket of claim 3 wherein the latch means include first and second electrically conductive studs each disposed in the forward end of a respective side member and each having a mounting opening by which the socket is secured to a circuit board, and a electrically conductive latch mechanism cooperative with the confronting end of a respective latch arm to retain the latch arm in a closed position.

4. The socket of claim 2 wherein said pivot means include a pedestal at the rearward end of each of the side members, each having a substantially horizontal opening therein, and a pivot pin disposed in each pedestal opening and securing the cover assembly for pivotal attachment to the base.

5. The socket of claim 3 wherein the latch mechanism includes an electrically conductive spring element yieldably engageable with the confronting end of a respective latch arm to retain the latch arm in a closed position.

6. The socket of claim 2 wherein said mounting means includes openings in the base and matable with respective fasteners for securing the socket to a circuit board.

7. The socket of claim 2 wherein the insulating members each include a centrally disposed groove and inclined bottom surfaces extending outwardly and upwardly from the groove.

8. The socket of claim 2 wherein said base is of integral molded construction.

9. A socket for mounting a bubble memory having contact pads to an interconnection board having a ground plane, comprising:

a housing having first and second spaced-apart arms defining bubble memory receiving spaced-apart shoulders, each arm having a plurality of spaced-apart openings extending from the top to the bottom surface thereof, each opening is in communication with a recess defining an anti-overstress shelf provided on corresponding shoulders;

a plurality of electrical contacts individually slidably mounted in and frictionally engaged by the confronting walls of corresponding ones of said openings, each of said electrical contacts having a depending electrode tail extending below the bottom surface of corresponding arms for insertion into said interconnection board, and a laterally and inwardly directed resilient contact that confronts corresponding ones of said anti-overstress shelves for electrically contacting corresponding bubble memory contact pads, said anti-overstress shelves permitting probing of corresponding resilient contacts;

first and second electrically conductive and electrically interconnected, spaced-apart, and elongated latching arms;

first and second electrically non-conducting, resilient, and elongated contact pads respectively fastened to the first and the second latching arms, each of said first and second electrically non-conducting and resilient elongated pads is provided on its bottom with a central recess transverse its long axis, and with a "V"-shaped surface centered at said central recess and sloped upwardly from the central recess;

means for pivotally connecting said first and second electrically conducting latching arms to said first and second arms for rotation between an open condition adapted to allow the ready placement of the bubble memory device onto the bubble memory receiving shoulders, and a closed condition where the "V" shaped surfaces of the resilient contact pads abut and compliantly press the ends of the bubble memory device against the bubble memory receiving shoulders with its contact pads individually in electrical communication with corresponding ones of the resilient contacts of the electrical terminals;

electrically conductive means mounted to the first and second spaced-apart arms for releasably retaining the first and the second latching arms in the closed condition; and electrically conductive means fastened to said electrically conductive releasably retaining means for mounting the first and second arms to the interconnection board, and for electrically grounding said first and second latching arms.

10. The invention of claim 9, wherein said retaining means includes first and second electrically conductive studs respectively fastened to the ends of said first and second arms, each having first and second electrically conductive spring elements mounted thereto, which provide abutment surfaces against which the ends of corresponding ones of the electrically conductive arms are releasably engaged and electrically interconnected in said closed condition.

11. The invention of claim 10, wherein said mounting includes electrically conductive threaded fasteners mounted through the interconnection board and into corresponding studs in such a way that the threaded fasteners are electrically connected to the ground plane of the interconnection board and are electrically connected through the studs and through the spring elements to the first and second latching arms thereby grounding the same.

12. A magnetic bubble memory socket, comprising:
a base having first and second spaced-apart side members having electrical terminals mounted in spaced-apart terminal-receiving apertures provided therein, each of the terminals having a depending electrode tail adapted for insertion into a circuit board and a resilient head portion adapted to be received in anti-overstress shelves provided thereof that are individually in communication with corresponding ones of the terminal-receiving apertures;
a cover having first and second spaced-apart electrically interconnected and electrically conductive latching arms pivotally mounted to the first and second side members each having first and second resilient bumper pads fastened thereto for applying a compliant stress to a bubble memory device when the cover is in a closed condition;
electrically conductive latching means fastened to the ends of the arms for removably retaining the cover in the closed condition; and
means electrically connected to the latching means for mounting the first and second spaced-apart arms to an interconnection board and for electrically grounding the latching arms to the interconnection board.

13. The invention of claim 12, wherein the resilient pads fastened to the latching arms include a central groove transverse its long axis and have a bottom surface having a "V"-shape centered at the central transversely extending recess.

* * * * *